United States Patent
Iino et al.

(10) Patent No.: US 10,851,468 B2
(45) Date of Patent: Dec. 1, 2020

(54) SUBSTRATE PROCESSING APPARATUS AND SUBSTRATE PROCESSING METHOD

(71) Applicant: TOKYO ELECTRON LIMITED, Minato-ku (JP)

(72) Inventors: Tadashi Iino, Koshi (JP); Toru Ihara, Koshi (JP); Yoshihiro Kai, Koshi (JP); Yoichi Tokunaga, Koshi (JP)

(73) Assignee: TOKYO ELECTRON LIMITED, Minato-ku (JP)

( * ) Notice: Subject to any disclaimer, the term of this patent is extended or adjusted under 35 U.S.C. 154(b) by 536 days.

(21) Appl. No.: 15/458,327

(22) Filed: Mar. 14, 2017

(65) Prior Publication Data
US 2017/0283977 A1    Oct. 5, 2017

(30) Foreign Application Priority Data
Mar. 29, 2016    (JP) .................... 2016-065660

(51) Int. Cl.
| | |
|---|---|
| C25D 17/08 | (2006.01) |
| H01L 21/687 | (2006.01) |
| H01L 21/67 | (2006.01) |
| C25D 7/12 | (2006.01) |
| C25D 17/00 | (2006.01) |
| C25D 21/12 | (2006.01) |

(Continued)

(52) U.S. Cl.
CPC .............. *C25D 17/08* (2013.01); *C25D 7/12* (2013.01); *C25D 17/007* (2013.01); *C25D 21/12* (2013.01); *H01L 21/2885* (2013.01); *H01L 21/67023* (2013.01); *H01L 21/6723* (2013.01); *H01L 21/67173* (2013.01); *H01L 21/67253* (2013.01); *H01L 21/67742* (2013.01); *H01L 21/6875* (2013.01); *H01L 21/68728* (2013.01); *H01L 21/68742* (2013.01); *H01L 21/68785* (2013.01); *H01L 21/68792* (2013.01)

(58) Field of Classification Search
None
See application file for complete search history.

(56) References Cited

U.S. PATENT DOCUMENTS

4,652,345 A * 3/1987 McBride ................ H05K 3/187
                                                          205/86
4,696,729 A * 9/1987 Santini ................. C25D 17/001
                                                          204/224 R (Continued)

FOREIGN PATENT DOCUMENTS

| JP | 2003-092343 A | 3/2003 |
| JP | 2008-004880 A | 1/2008 |

(Continued)

*Primary Examiner* — Stefanie S Wittenberg
(74) *Attorney, Agent, or Firm* — Oblon, McClelland, Maier & Neustadt, L.L.P.

(57) ABSTRACT

A substrate processing apparatus includes a holding device that includes a conductive member and holds a substrate, a conduction path structure that includes a conductive material and positioned such that the conduction path structure is in contact with the holding device, a supply device that supplies a processing liquid to the substrate held by the holding device, and a grounding structure including a variable resistance device that changes a resistance such that the grounding structure has a first end portion connected the conduction path structure and a second end portion connected to a ground potential.

20 Claims, 10 Drawing Sheets

(51) Int. Cl.
*H01L 21/288* (2006.01)
*H01L 21/677* (2006.01)

(56) References Cited

U.S. PATENT DOCUMENTS

| | | | |
|---|---|---|---|
| 6,136,163 A * | 10/2000 | Cheung | H01L 21/67098 |
| | | | 204/198 |
| 2003/0132118 A1* | 7/2003 | Kovarsky | C25D 7/12 |
| | | | 205/89 |
| 2008/0189975 A1* | 8/2008 | Miya | H01L 21/68728 |
| | | | 34/317 |
| 2009/0269925 A1* | 10/2009 | Sunayama | C25D 5/10 |
| | | | 438/674 |
| 2013/0292254 A1* | 11/2013 | Kumar | C25D 17/001 |
| | | | 205/81 |

FOREIGN PATENT DOCUMENTS

| | | |
|---|---|---|
| JP | 2008-198836 A | 8/2008 |
| JP | 2009-238862 A | 10/2009 |

\* cited by examiner

SUBSTRATE PROCESSING APPARATUS AND SUBSTRATE PROCESSING METHOD

CROSS-REFERENCE TO RELATED APPLICATIONS

The present application is based upon and claims the benefit of priority to Japanese Patent Application No. 2016-065660, filed Mar. 29, 2016, the entire contents of which are incorporated herein by reference.

BACKGROUND OF THE INVENTION

Field of the Invention

An embodiment disclosed herein relates to a substrate processing apparatus and a substrate processing method.

Description of Background Art

Japanese Patent Laid-Open Publication No. 2003-092343 describes a substrate processing apparatus that processes a substrate such as a semiconductor wafer or a glass substrate by supplying a processing liquid to the substrate. The entire contents of this publication are incorporated herein by reference.

SUMMARY OF THE INVENTION

According to one aspect of the present invention, a substrate processing apparatus includes a holding device that includes a conductive member and holds a substrate, a conduction path structure that includes a conductive material and positioned such that the conduction path structure is in contact with the holding device, a supply device that supplies a processing liquid to the substrate held by the holding device, and a grounding structure including a variable resistance device that changes a resistance such that the grounding structure has a first end portion connected the conduction path structure and a second end portion connected to a ground potential.

According to another aspect of the present invention, a substrate processing method includes holding a substrate, and supplying a processing liquid to the substrate connected to a ground potential. The supplying of the processing liquid includes changing a resistance between the substrate and the ground potential by a variable resistance device that changes the resistance.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
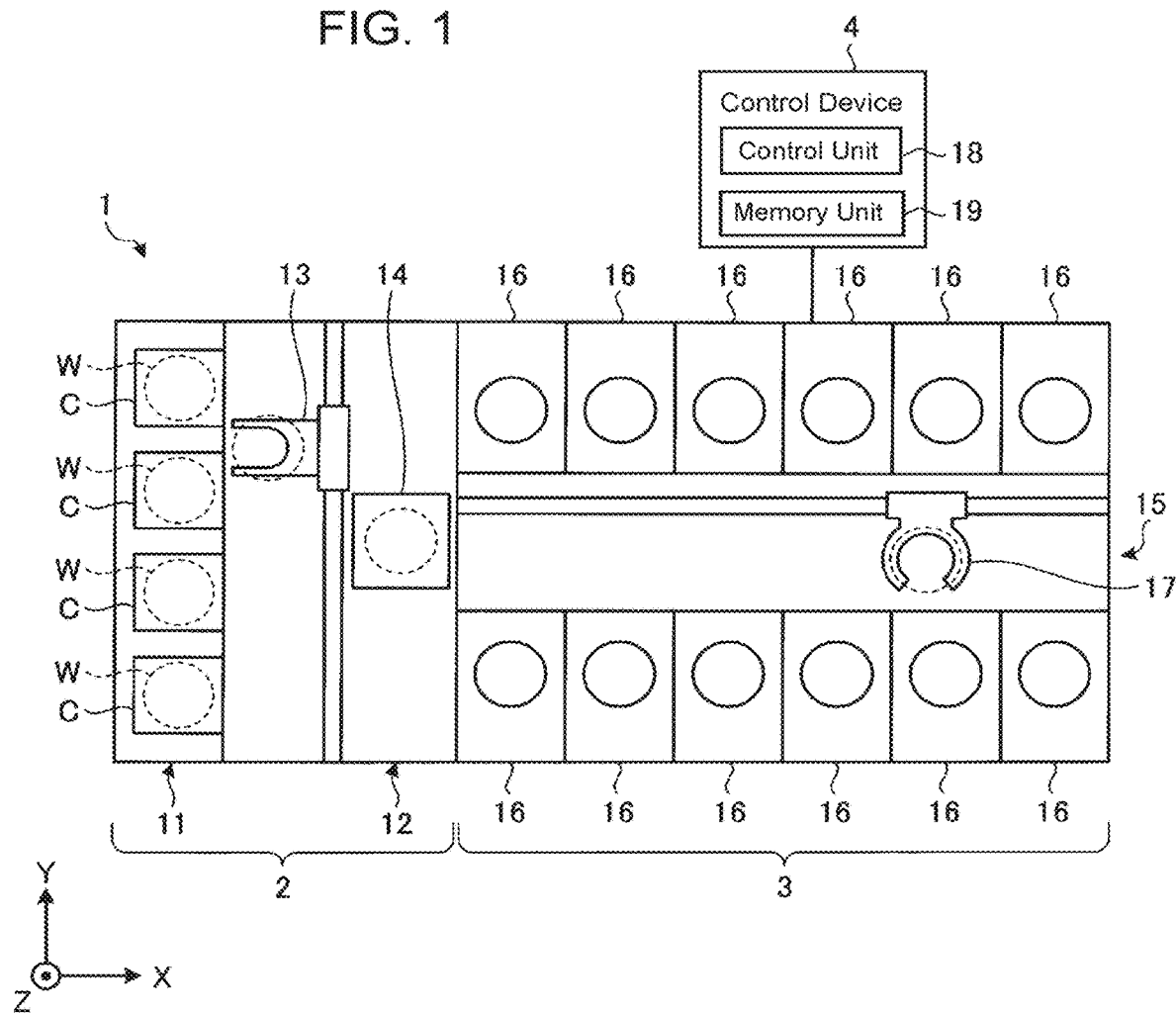
FIG. 1 illustrates a schematic structure of a substrate processing system according to an embodiment.

The embodiments will now be described with reference to the accompanying drawings, wherein like reference numerals designate corresponding or identical elements throughout the various drawings.

FIG. 1 is a view schematically showing the structure of a substrate processing system according to an embodiment of the present invention. In the following, X, Y and Z axes intersecting each other at right angles are specified to clarify positional relationships, and a positive direction of the Z axis is set as the vertically upward direction.

As shown in FIG. 1, substrate processing system 1 is provided with loading station 2 and processing station 3. Loading station 2 and processing station 3 are positioned to be adjacent to each other.

Loading station 2 includes carrier mounting zone 11 and transport zone 12. Multiple carriers (C), which horizontally accommodate multiple substrates—semiconductor wafers (hereinafter wafers (W)) in the present embodiment—are mounted in carrier mounting zone 11.

Transport zone 12 is positioned adjacent to carrier mounting zone 11, and is provided with substrate transport apparatus 13 and delivery table 14. Substrate transport apparatus 13 has a wafer holding mechanism for holding a wafer (W). Substrate transport apparatus 13 is capable of moving horizontally and vertically as well as rotating around the vertical axis, and transports a wafer (W) between a carrier (C) and delivery part 14 using the wafer holding mechanism.

Processing station 3 is positioned adjacent to transport zone 12. Processing station 3 includes transport zone 15 and multiple processing units 16. Multiple processing units 16 are aligned on each side of transport zone 15.

Substrate transport device 17 is provided in transport zone 15. Substrate transport device 17 includes a wafer holding mechanism for holding a wafer (W). In addition, substrate transport device 17 is capable of moving horizontally and vertically as well as rotating around the vertical axis, and transports a wafer (W) between delivery part 14 and processing unit 16 using the wafer holding mechanism.

Processing unit 16 conducts predetermined treatments on a wafer (W) transported by substrate transport device 17.

Substrate processing system 1 includes control device 4. Control device 4 is a computer, for example, and includes control unit 18 and memory unit 19. Memory unit 19 stores a program for controlling various treatments carried out in substrate processing system 1. Control unit 18 controls operations to be performed in substrate processing system 1 by reading out and executing the program stored in memory unit 19.

Such a program may be stored in a computer-readable medium and installed from the memory medium onto memory unit 19 of control device 4. Examples of a computer-readable medium are hard disks (HD), flexible disks (FD), compact discs (CD), magneto-optical discs (MO), memory cards and the like.

In substrate processing system 1 structured as above, first, substrate transport apparatus 13 of loading station 2 takes out a wafer (W) from carrier (C) in carrier mounting zone 11, and loads the wafer (W) on delivery table 14. The wafer (W) loaded on delivery part 14 is unloaded by substrate transport device 17 of processing station 3 to be loaded into processing unit 16.

The wafer (W) loaded into processing unit 16 is treated in processing unit 16 and is unloaded from processing unit 16 by substrate transfer device 17 to be loaded onto delivery table 14. Then, the treated wafer (W) loaded on delivery part 14 is returned by substrate transport apparatus 13 to carrier (C) in carrier mounting zone 11.

Figure 2:
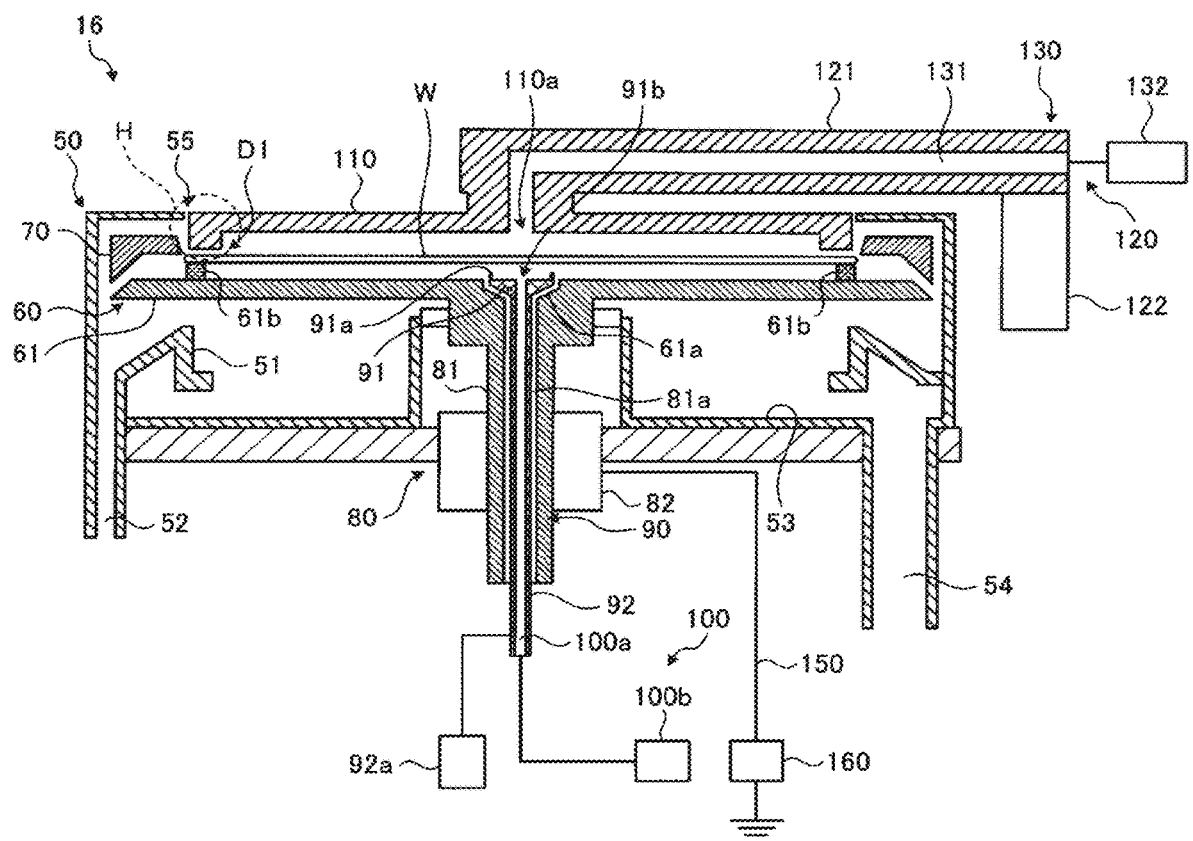
FIG. 2 is a schematic cross-sectional view illustrating a structure of a processing unit.

A schematic structure of a processing unit 16 is described with reference to FIG. 2. FIG. 2 is a schematic cross-sectional view illustrating the structure of the processing unit 16.

As illustrated in FIG. 2, the processing unit 16 includes a collection cup 50, a holding part 60, a rotating ring 70, a rotation mechanism 80, a substrate lift mechanism 90, a processing liquid supply part 100, a top plate 110, a lift mechanism 120, and an inert gas supply part 130.

The collection cup 50, the holding part 60 and the rotating ring 70 are accommodated in a chamber (not illustrated in the drawings). An FFU (Fan Filter Unit) (not illustrated in the drawings) is provided in a ceiling part of the chamber. FFU forms a down flow in the chamber.

The holding part 60 has a base plate 61 and multiple support pins (61b). The base plate 61 is horizontally provided and has a circular recess part (61a) at a center. Here, the base plate 61 is integrally formed with a later-described rotation shaft 81. However, it is also possible that the base plate 61 and the rotation shaft 81 are formed as separate bodies.

The multiple support pins (61b) are provided at substantially equal intervals along a circumferential direction of the holding part 60 on an upper surface of the holding part 60. The support pins (61b) are each provided protruding from the holding part 60 with a front end portion facing upward, and support a wafer (W) from below in a state in which the wafer (W) floats from the holding part 60.

The rotating ring 70 is positioned on an outer side of an outer periphery of the wafer (W) that is supported by the holding part 60, and is provided so as to surround an entire circumference of a peripheral edge portion of the wafer (W). Further, the rotating ring 70 is coupled to the holding part 60 and is provided capable of integrally rotating with the holding part 60.

The rotating ring 70 functions as a liquid receiving part and guides a processing liquid to a drain cup 51 for drainage, the processing liquid being supplied to a back surface side of the wafer (W) by the processing liquid supply part 100 (to be described later) and being used for the processing of the wafer (W). Further, the rotating ring 70 also plays a role of preventing a processing liquid, which is supplied to the back surface side of the wafer (W) and is scattered from the rotating wafer (W) toward an outer peripheral side, from being bounced back and returning to the wafer (W) again, or from coming around to an upper surface side of the wafer (W).

The rotation mechanism 80 includes the rotation shaft 81 and an electric motor 82. The rotation shaft 81 rotatably supports the base plate 61. Specifically, the rotation shaft 81 is provided so as to extend downward from the base plate 61, and has a cylindrical shape in which a through hole (81a) is provided at a center.

The electric motor 82 causes the rotation shaft 81 to rotate about a vertical axis. Due to the rotation of the rotation shaft 81, the holding part 60 and the rotating ring 70 integrally rotate with each other. A specific structure of the rotation mechanism 80 will be described later with reference to FIG. 5.

The substrate lift mechanism 90 has a lift plate 91 and a lift shaft 92 that are provided movable up and down in the recess part (61a) of the base plate 61 and the through hole (81a) of the rotation shaft 81. The lift plate 91 has multiple, for example, five, lift pins (91a) on a peripheral edge thereof.

The lift shaft 92 extends downward from the lift plate 91. A processing liquid supply pipe (100a) is provided at centers of the lift plate 91 and the lift shaft 92. Further, a cylinder mechanism (92a) is connected to the lift shaft 92. By raising or lowering the lift shaft 92, the lift pins (91a) are raised or lowered between a position lower than a height position at which the wafer (W) is supported by the support pins (61b) and a position higher than the height position. As a result, the wafer (W) is raised or lowered, and loading or unloading of the wafer (W) to or from the holding part 60 is performed.

The processing liquid supply part 100 has the processing liquid supply pipe (100a). As described above, the processing liquid supply pipe (100a) is provided so as to extend along an inner space of the lift plate 91 and the lift shaft 92.

The processing liquid supply pipe (100a) guides a processing liquid supplied from pipes of a processing liquid pipe group (100b) to the back surface side of the wafer (W). Thereby, the processing liquid supply part 100 supplies the processing liquid to the back surface side of the wafer (W). The processing liquid supply pipe (100a) is communicatively connected to a processing liquid supply port (91b) formed on an upper surface of the lift plate 91.

The collection cup 50 has a drain cup 51, a drain pipe 52, an exhaust cup 53 and an exhaust pipe 54. Further, the collection cup 50 has an opening 55 provided in an upper surface thereof. The collection cup 50 mainly plays a role of recovering a gas and a liquid discharged from a space surrounded by the holding part 60 and the rotating ring 70.

The drain cup 51 receives a processing liquid guided by the rotating ring 70. The drain pipe 52 is connected to a bottom part of the drain cup 51, and discharges the processing liquid received by the drain cup 51 through a pipe of a drainage pipe group (not illustrated in the drawings).

The exhaust cup 53 is provided to be communicatively connected to the drain cup 51 outside or below the drain cup 51. FIG. 2 illustrates an example in which the exhaust cup 53 is provided to be communicatively connected to the drain cup 51 inside and below a peripheral edge of the drain cup 51.

The exhaust pipe 54 is connected to a bottom part of the exhaust cup 53, and exhausts a gas such as a nitrogen gas in the exhaust cup 53 through a pipe of an exhaust pipe group (not illustrated in the drawings).

The top plate 110 is movable up and down, and is provided so as to close the opening 55 provided in the upper surface of the collection cup 50 in a lowered state. Further, the top plate 110 is provided so as to cover the wafer (W) supported by the support pins (61b) from above when closing the opening 55 provided in the upper surface of the collection cup 50.

A peripheral edge portion of the top plate 110 facing the peripheral edge portion of the wafer (W) supported by the support pins (61b) is provided projecting downward toward the wafer (W), and a gap (D1) is formed between the peripheral edge portion of the top plate 110 and the peripheral edge portion of the wafer (W). The gap (D1) is smaller than a distance between a center portion of the wafer (W) supported by the support pins (61b) and the top plate 110.

The lift mechanism 120 includes an arm 121 and a lift driving part 122. The lift driving part 122 is provided outside the collection cup 50 and is movable up and down. The arm 121 is provided to connect the top plate 110 and the lift driving part 122. That is, the lift mechanism 120 raises or lowers the top plate 110 via the arm 121 by the lift driving part 122.

The inert gas supply part 130 includes an inert gas supply pipe 131 and an inert gas supply source 132. The inert gas supply part 130 supplies an inert gas to the upper surface side of the wafer (W).

The inert gas supply pipe 131 is provided extending inside the top plate 110 and the arm 121, and one end of the inert gas supply pipe 131 is connected to the inert gas supply source 132 that supplies the inert gas at one end. Further, the other end of the inert gas supply pipe 131 is communicatively connected to an inert gas supply port (110a).

As illustrated in FIG. 2, by connecting the arm 121 at substantially a center of an upper surface of the top plate 110, the inert gas supply port (110a) is formed at a center portion of a lower surface of the top plate 110. Therefore, an inert gas can be supplied downward from a center of the top plate 110, and a flow rate of the inert gas supplied to the wafer (W) can be uniformized along a circumferential direction.

The processing unit 16 includes a grounding part 150 and a variable resistance part 160. One end part of the grounding part 150 is connected to the rotation mechanism, and the other end part of the grounding part 150 is connected to a ground potential. The variable resistance part 160 is a resistor provided in the grounding part 150, and has a variable resistance.

Structure of Conduction Path

In the processing unit 16 according to the present embodiment, electricity generated in the wafer (W) is conducted to the ground potential via the holding part 60, the rotation mechanism 80, and the grounding part 150, and thereby, the wafer (W) can be neutralized. Here, a structure of a conduction path for the electricity generated in the wafer (W) is specifically described.

Figure 3:
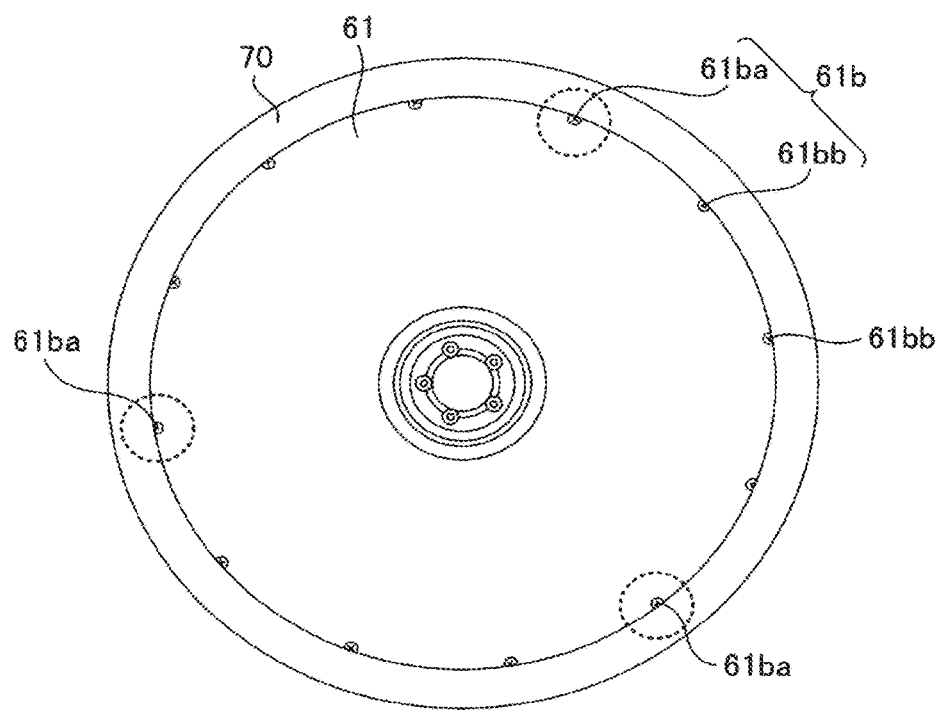
FIG. 3 is a plan view of a base plate and a rotating ring.
Figure 4:
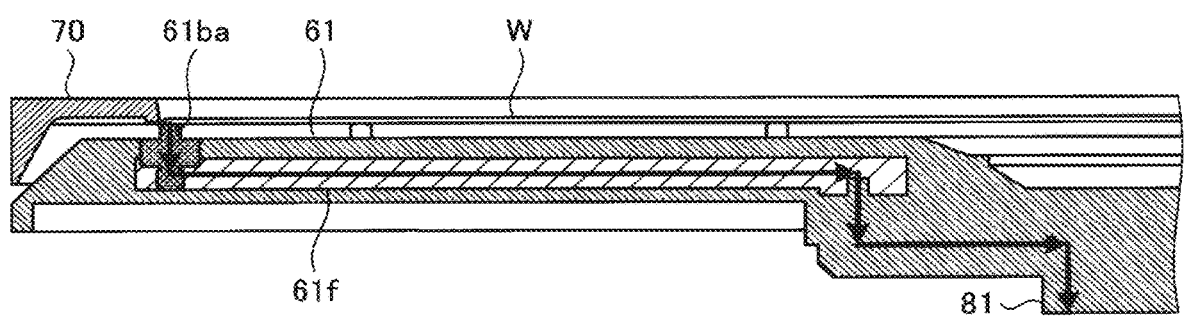
FIG. 4 illustrates a structure of a conduction path from a wafer to a rotation shaft.

A conduction path from the wafer (W) to the rotation shaft 81 is described with reference to FIGS. 3 and 4. FIG. 3 is a plan view of the base plate 61 and the rotating ring 70. Further, FIG. 4 illustrates a structure of the conduction path from the wafer (W) to the rotation shaft 81.

As illustrated in FIG. 3, the support pins (61b), for example, are formed of resin, and include two types of support pins: first support pins (61ba) and second support pins (61bb). When the first support pins (61ba) and the second support pins (61bb) are compared to each other, the first support pins (61ba) are formed of a material having higher conductivity than the second support pins (61bb).

The second support pins (61bb) are formed of a material having higher durability against chemicals than the first support pins (61ba). It is also possible that the second support pins (61bb) are formed of a non-conductive material for reasons such as that durability is regarded as important.

As illustrated by closed curves of broken lines in FIG. 3, for examples, three first support pins (61ba) are provided, and these first support pins (61ba) are positioned at substantially equal intervals, that is, at intervals of substantially 120 degrees, along a circumferential direction on a periphery edge of the base plate 61.

Between each adjacent two of the first support pins (61ba), for example, three second support pins (61bb) are provided at substantially equal intervals along the circumferential direction on the peripheral edge of the base plate 61. Therefore, a total of twelve support pins (61b) are positioned at intervals of substantially 30 degrees.

As indicated by arrows in FIG. 4, the electricity generated in the wafer (W) is conducted from the first support pins (61ba) that are formed of a conductive material to inside of the base plate 61.

A conductive member (61f) is provided inside the base plate 61. The conductive member (61f) is in contact with the first support pins (61ba). As a result, the electricity from the first support pins (61ba) is conducted to the conductive member (61f).

The conductive member (61f) extends to a vicinity of the rotation shaft 81, and the electricity conducted to the conductive member (61f) is conducted to the rotation shaft 81. The rotation shaft 81 is formed of a conductive material.

In the present embodiment, a conduction path from the first support pins (61ba) through the conductive member (61f) is formed, and the electricity generated in the wafer (W) is conducted from the first support pins (61ba) via the conductive member (61f) of the base plate 61 to the rotation shaft 81.

In the present embodiment, three of the twelve support pins (61b) are the first support pins (61ba). However, the number or a ratio or the like of the first support pins (61ba) is not limited. The number of the first support pins (61ba) can be appropriately adjusted depending on whether or not the wafer (W) is appropriately neutralized.

Figure 5:
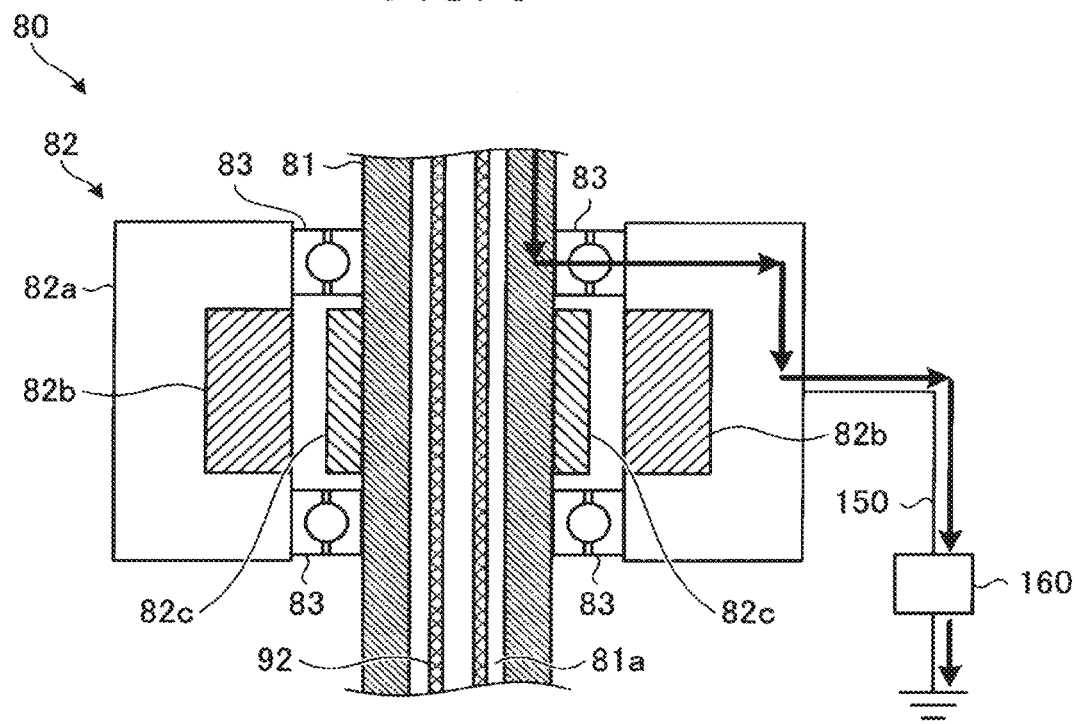
FIG. 5 illustrates a structure of a conduction path from the rotation shaft to a ground potential.

A structure of a conduction path from the rotation shaft 81 to the ground potential is described with reference to FIG. 5. FIG. 5 illustrates the structure of the conduction path from the rotation shaft 81 to the ground potential.

As illustrated in FIG. 5, the rotation mechanism 80 includes the rotation shaft 81, the electric motor 82, and a bearing 83. Further, the electric motor 82 includes a housing (82a), a stator (82b) and a rotor (82c).

The housing (82a) is formed, for example, in a cylindrical shape and accommodates the stator (82b) and the rotor (82c) therein. The housing (82a) is formed of a conductive material. The stator (82b) is provided on an inner peripheral surface of the housing (82a). The rotor (82c) is positioned on an inner peripheral side of the stator (82b) and opposes the stator (82b) across a gap. The rotor (82c) is provided on an outer peripheral surface of the rotation shaft 81, and opposes the stator (82b).

The bearing 83 is provided between the housing (82a) and the rotation shaft 81 and rotatably supports the rotation shaft 81. The bearing 83, for example, is a ball bearing and is formed of a conductive material.

The grounding part 150, for example, is a ground wire. One end part of the grounding part 150 is connected to the housing (82a), and the other end part of the grounding part 150 is connected to the ground potential.

In the present embodiment, a conduction path from the rotation shaft 81 through the bearing 83, the housing (82a) and the grounding part 150 is formed. Therefore, the electricity generated in the wafer (W), first, as illustrated in FIG. 4, is conducted from the first support pins (61ba) via the conductive member (61f) of the base plate 61 to the rotation shaft 81, and thereafter, as illustrated in FIG. 5, is conducted from the rotation shaft 81 via the bearing 83, the housing (82a) and the grounding part 150 to the ground potential. As a result, the wafer (W) can be neutralized.

In the present embodiment, the rotation mechanism 80 corresponds to an example of a "conduction path part". However, the conduction path part is not necessarily required to be the rotation mechanism, but can be any object that is in contact with the holding part 60 and is formed of a conductive material. Therefore, the substrate processing apparatus and the substrate processing method disclosed in the present application can also be applied to a substrate processing apparatus that does not have a rotation mechanism.

Structure and Operation of Variable Resistance Part

Basically, it is preferable that a conduction path for neutralizing a substrate have a low resistance. However, in a series of substrate processing processes, it is also possible that, in some cases, it is not preferable to always keep the resistance of the conduction path low.

For example, in a case where a processing liquid supplied from the processing liquid supply port (91b) (see FIG. 2) is itself charged, when the resistance of the conduction path is low (for example, is 0), an electric current flows at once to the wafer (W) and electric discharge occurs. As a result, it is possible that a pattern on the substrate is damaged. Although the wafer (W) has been subjected to an insulation treatment, the wafer (W) is slightly conductive. Therefore, an electric current flows at the moment when the processing liquid arrives at the wafer (W).

Therefore, in the processing unit 16 according to the present embodiment, the variable resistance part 160 is provided in the grounding part 150, and the resistance of the conduction path can be varied by the variable resistance part 160. Specifically, for a predetermined period of time from the start of supplying the processing liquid to the wafer (W), the resistance of the conduction path is increased to be higher than that in other periods of time by the variable resistance part 160. Thereby, occurrence of the above-described electric discharge is suppressed.

Figure 6:
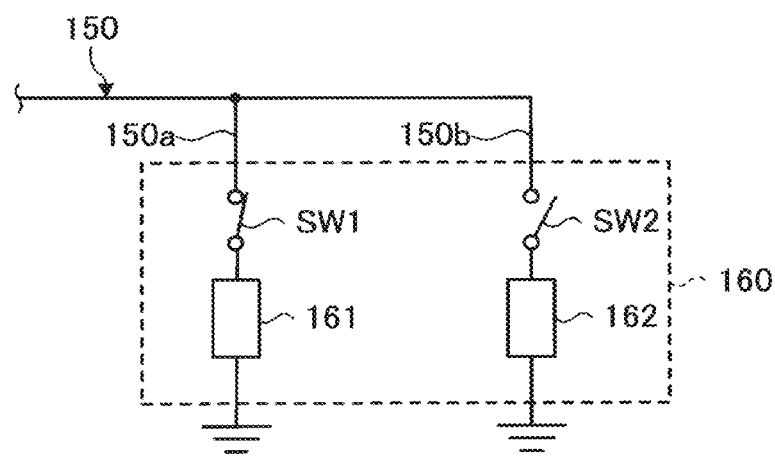
FIG. 6 illustrates an example of a structure of a variable resistance part.

An example of a structure of the variable resistance part 160 is described with reference to FIG. 6. FIG. 6 illustrates an example of the structure of the variable resistance part 160.

As illustrated in FIG. 6, the other end part of the grounding part 150 is branched to a first path (150a) and a second path (150b), which are each connected to the ground potential.

The variable resistance part 160 includes a first resistor 161, a second resistor 162, a first switch (SW1), and a second switch (SW2).

The first resistor 161 and the second resistor 162, for example, are each a resistor having a certain resistance. The first resistor 161 is provided in the first path (150a), and the second resistor 162 is provided in the second path (150b). The resistance (second resistance) of the second resistor 162 is higher than the resistance (first resistance) of the first resistor 161.

The first switch (SW1) and the second switch (SW2) switch a resistor connected to the grounding part 150 between the first resistor 161 and the second resistor 162. The first switch (SW1) is provided in the first path (150a), and the second switch (SW2) is provided in the second path (150b). The first switch (SW1) and the second switch (SW2) are each turned on or off based on a control signal from the control unit 18.

Figure 7:
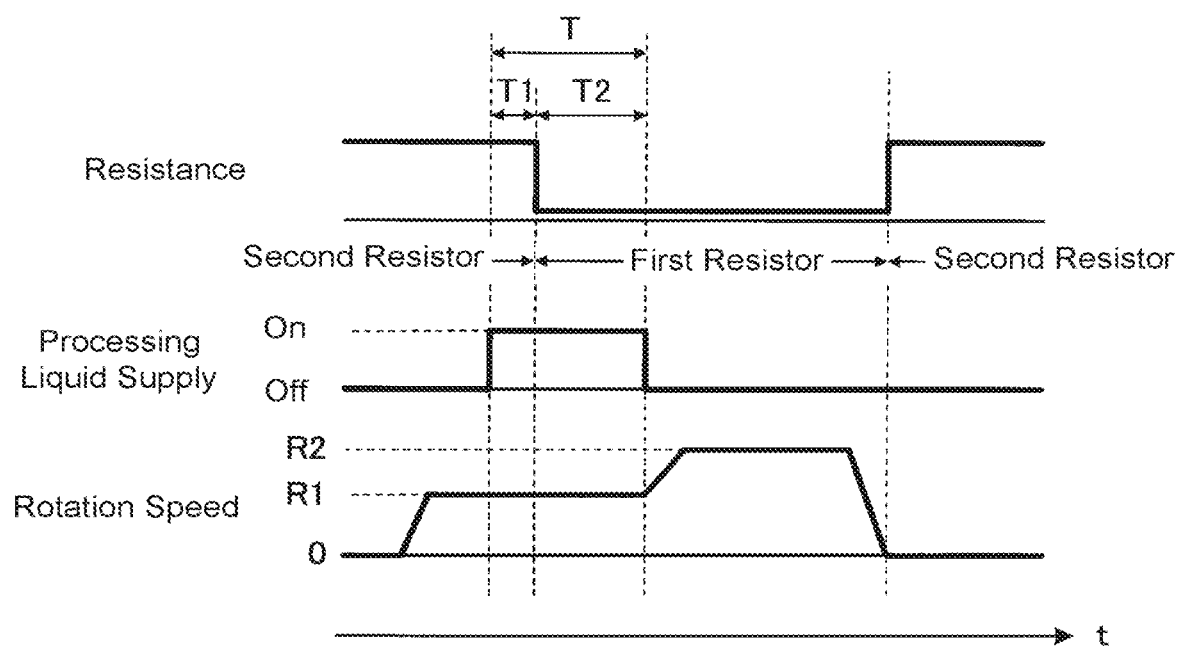
FIG. 7 is a timing chart for describing an example of a resistance change process.

Timing for changing the resistance of the variable resistance part 160 is described with reference to FIG. 7. FIG. 7 is a timing chart for describing an example of a resistance change process.

As illustrated in FIG. 7, after the wafer (W) is supported on the support pins (61b) of the holding part 60, the control unit 18 controls the rotation mechanism 80 to rotate the wafer (W) at a first rotation speed (R1). Thereafter, the control unit 18 starts supplying a processing liquid from the processing liquid supply port (91b) to the back surface side of the wafer (W). The supplying of the processing liquid is continued for a processing liquid supply period (T).

Subsequently, when the processing liquid supply period (T) ends, the control unit 18 stops supplying the processing liquid from the processing liquid supply port (91b). Thereafter, the control unit 18 subjects the wafer (W) to shake-off drying (drying treatment) by increasing the rotation speed of the wafer (W) from R1 to R2. When the drying treatment is finished, the control unit 18 stops the rotation of the wafer (W).

In such a series of substrate processing processes, the control unit 18 controls the variable resistance part 160 such that, during the processing liquid supply period (T), the resistance of the variable resistance part 160 in a first period (T1) immediately after the start is higher than the resistance of the variable resistance part 160 in a subsequent second period (T2).

Specifically, in the first period (T1), the control unit 18 connects the second resistor 162 having a relatively high resistance to the grounding part 150. Then, when the first period (T1) ends, the control unit 18 connects the first resistor 161 having a lower resistance than the second resistor 162 to the grounding part 150 by bringing the second switch (SW2) to an open state and the first switch (SW1) to a closed state.

As a result, the resistance of the conduction path in the first period (T1) immediately after the supply of the processing liquid to the wafer (W) is started can be increased to be higher than that in the subsequent second period (T2). Therefore, even when a charged processing liquid arrives at the wafer (W), an electric current hardly flows in the wafer (W) and the electric discharge phenomenon is unlikely to occur. Therefore, a damage to a pattern due to the electric discharge can be prevented.

As described above, the support pins (61b) (see FIG. 2) of the holding part 60 are formed using a conductive resin. For such a conductive resin, variation in resistance is large. Therefore, it is preferable that the second resistor 162 be a resistor having such a resistance that a sum of a predetermined value (such as an average value) as a resistance of each of the support pins (61b) and the resistance of the second resistor 162 is within a predetermined management value.

It is preferable that, even when power is turned off, one of the first path (150a) and the second path (150b) be connected to the ground potential. Here, basically, it is preferable that the resistance of the conduction path be as low as possible. Therefore, it is preferable that a contact point (b) be used for the first switch (SW1), and a contact point (a) be used for the second switch (SW2). The contact point (b) is a contact point that is usually in a closed state and is in an open state when an electrical signal is input. The contact point (a) is a contact point that is usually in an open state and is in a closed state when an electrical signal is input. Without being limited to this, it is also possible that the contact point (a) is used for the first switch (SW1), and the contact point (b) is used for the second switch (SW2).

Figure 8:
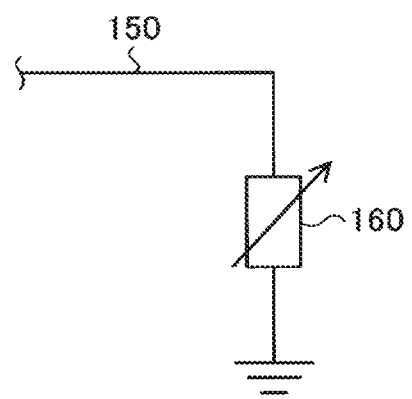
FIG. 8 illustrates another example of a structure of a variable resistance part.
Figure 9:
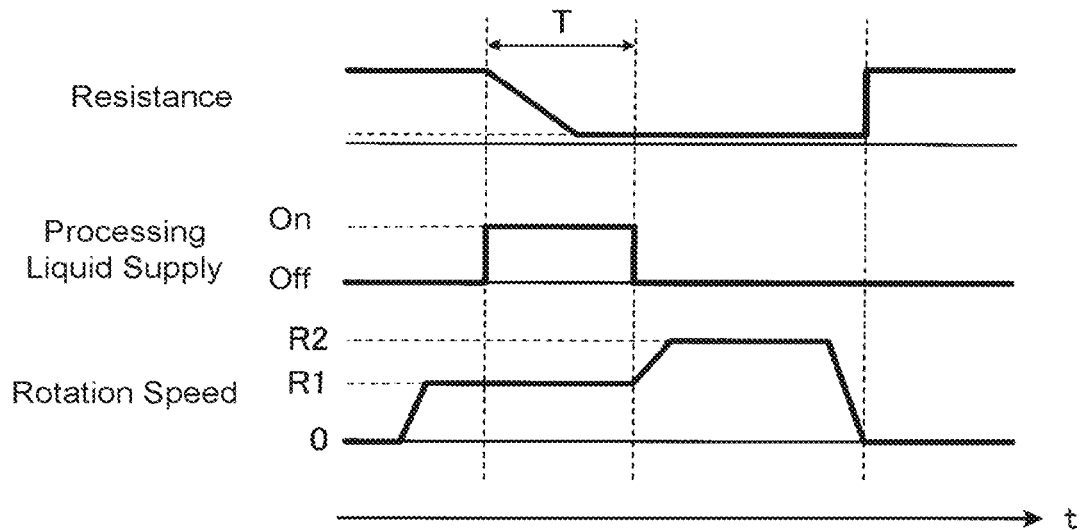
FIG. 9 is a timing chart for describing another example of a resistance change process.

Another structural example of the variable resistance part 160 and timing for changing the resistance of such a variable resistance part 160 are described with reference to FIGS. 8 and 9. FIG. 8 illustrates another example of a structure of the variable resistance part 160. FIG. 9 is a timing chart for describing another example of a resistance change process.

As illustrated in FIG. 8, the variable resistance part 160 may be a variable resistor that changes a resistance according to a signal input from the control unit 18.

As illustrated in FIG. 9, when the variable resistance part 160 is a variable resistor, the control unit 18 sets the resistance of the variable resistance part 160 to a relatively high first resistance before the start of a processing liquid supply process, and, after the supply of the processing liquid to the wafer (W) is started, gently decreases the resistance of the variable resistance part 160 during the processing liquid supply period (T). Even in such a case, it can be prevented that electric current flows at once to the wafer (W) immediately after the processing liquid arrives at the wafer (W). Therefore, a damage of a pattern due to electric discharge can be prevented.

First Modified Embodiment

In the above-described embodiment, electricity generated in the wafer (W) is released to the ground potential via the support pins (61*b*), the conductive member (61*f*), the rotation shaft 81, the bearing 83, the housing (82*a*) and the grounding part 150.

However, a resistance of the bearing 83 increases as the rotation speed increases. This is because as the rotation speed increases, an oil film is formed stretching around balls of the bearing 83 so that the balls float from an orbital surface, and thereby, the balls are in a nearly insulated state. In this way, when the bearing 83 having a resistance that varies depending on the rotation speed is included in the conduction path, the resistance of the conduction path may become unstable.

Figure 10:
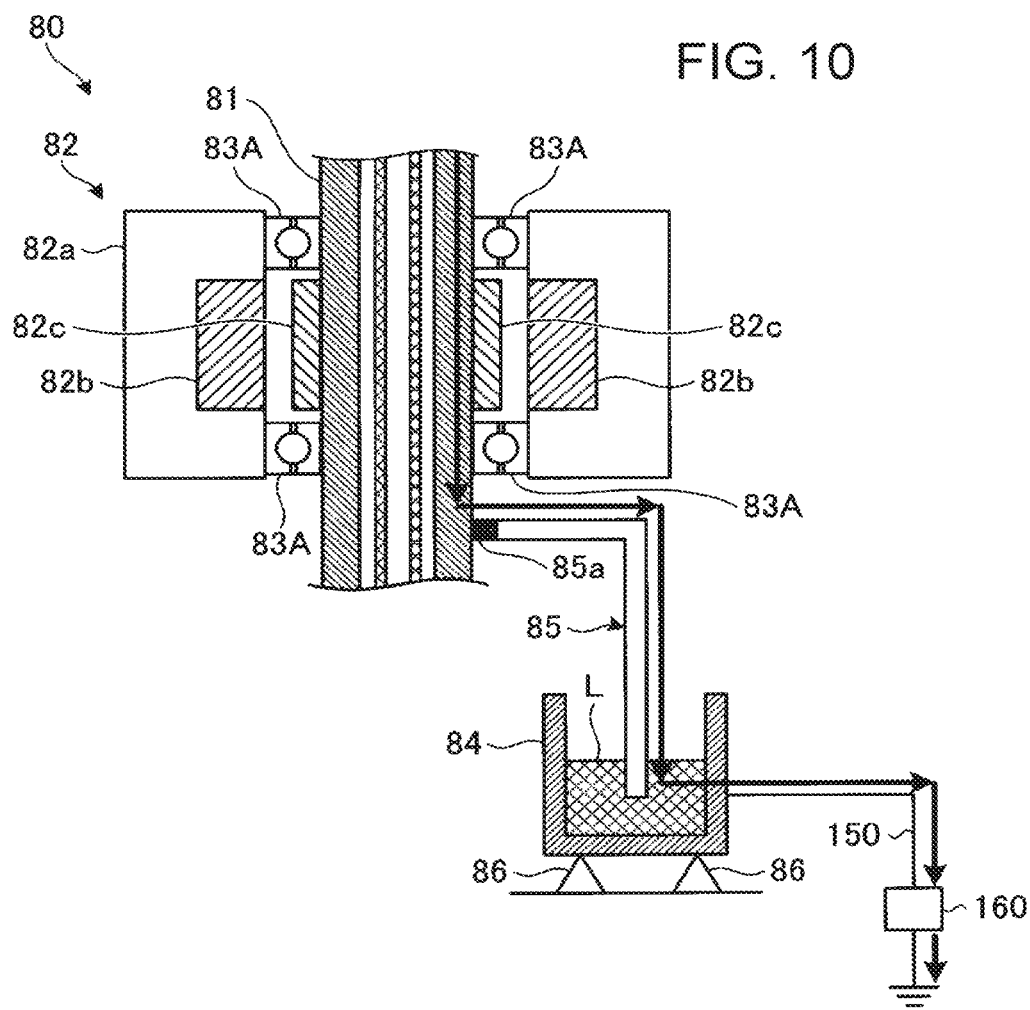
FIG. 10 illustrates a structure of a conduction path according to a first modified embodiment.

Therefore, in a first modified embodiment, a structure of a conduction path that does not include the bearing 83 is described with reference to FIG. 10. FIG. 10 illustrates the structure of the conduction path according to the first modified embodiment.

As illustrated in FIG. 10, the rotation mechanism 80 further includes a conductive container 84, a conductive connection member 85 and an insulating support member 86, and one end part of the grounding part 150 is connected to the container 84.

A conductive liquid (L) is stored in the container 84. As the liquid (L), an ionic liquid or a liquid metal can be used. The connection member 85, for example, is formed of metal. One end part of the connection member 85 is in electrical contact with a circumferential surface of the rotation shaft 81 via a brush (85*a*), and the other end part of the connection member 85 is immersed in the liquid (L). The support member 86 supports the container 84.

The conduction path according to the first modified embodiment is structured as described above. Electricity generated in the wafer (W) conducts to the ground potential via the support pins (61*b*), the conductive member (61*f*), the rotation shaft 81, the connection member 85, the liquid (L), the container 84 and the grounding part 150.

The processing unit 16 according to the first modified embodiment is provided with an insulating bearing (83A) in place of the conductive bearing 83.

In this way, by structuring a path that does not include the bearing (83A) as the conduction path for the electricity generated in the wafer (W), the resistance of the conduction path can be stabilized. Further, by using the insulating bearing (83A), conduction via an unintended path can be prevented.

Second Modified Embodiment

Figure 11:
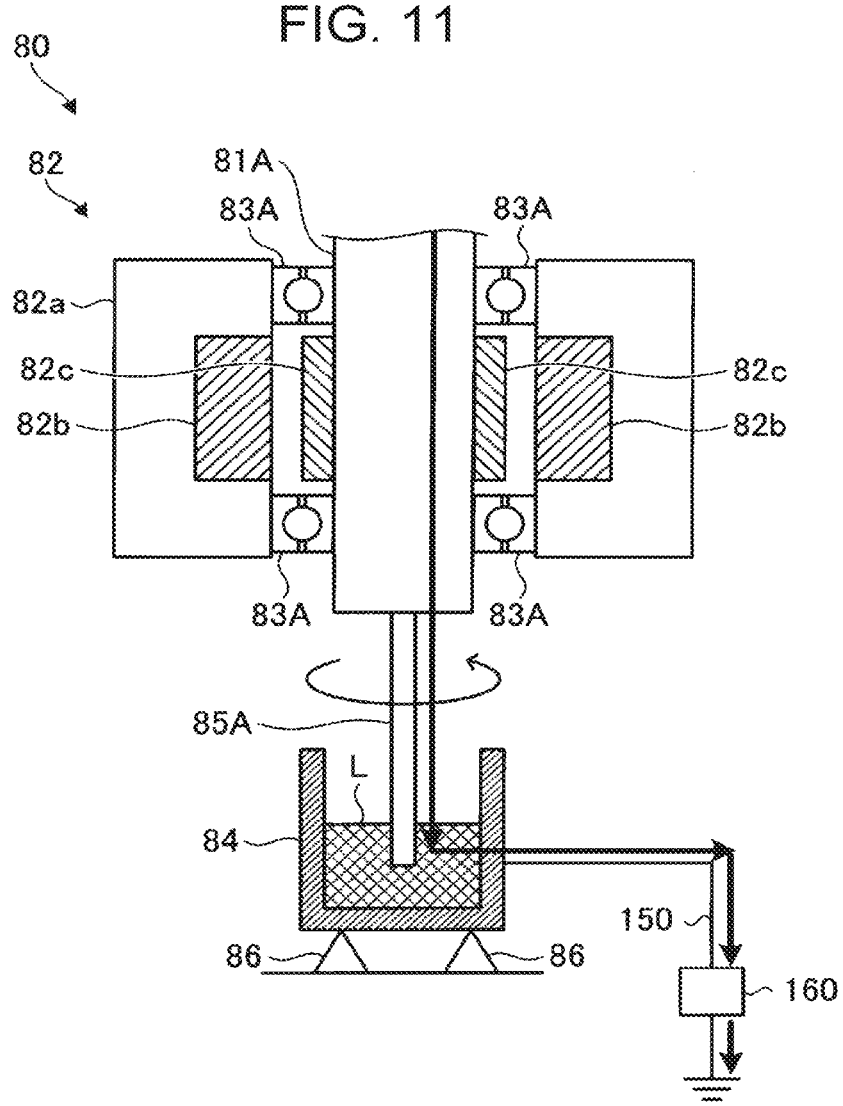
FIG. 11 illustrates a structure of a conduction path according to a second modified embodiment.

In the above-described first modified embodiment, the connection member 85 is brought into contact with the circumferential surface of the rotation shaft 81. However, it is also possible that the connection member is connected to an end on an opposite side of a load side of the rotation shaft 81. Such a second modified embodiment is described with reference to FIG. 11. FIG. 11 illustrates a structure of a conduction path according to the second modified embodiment.

As illustrated in FIG. 11, a rotation shaft (81A) according to the second modified embodiment is a solid member. A connection member (85A) according to the second modified embodiment has a rod shape extending in a longitudinal direction, and is connected coaxially with the rotation shaft to an end on an opposite side of a load side of the rotation shaft (81A).

Even in the case of such a structure, similar to the first modified embodiment, the resistance of the conduction path can be stabilized.

Third Modified Embodiment

Figure 12:
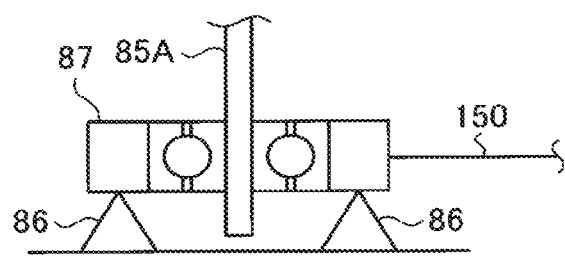
FIG. 12 illustrates a structure of a conduction path according to a third modified embodiment.

In the case where the connection member (85A) is coaxially rotated with the rotation shaft (81A) as in the above-described second modified embodiment, it is also possible that a conductive bearing is used in place of the container 84. Such a third modified embodiment is described with reference to FIG. 12. FIG. 12 illustrates a structure of a conduction path according to the third modified embodiment.

As illustrated in FIG. 12, the other end part of the connection member (85A) is rotatably supported by a conductive bearing 87. The bearing 87 is supported by the support member 86. The grounding part 150 is connected to the bearing 87.

In this way, it is also possible that the electricity generated in the wafer (W) is conducted from the connection member (85A) to the grounding part 150 via the bearing 87.

Fourth Modified Embodiment

The base plate 61 (see FIG. 2) is formed of a resin. The resin tends to generate static electricity, and the generated static electricity may adversely affect the wafer (W). Therefore, it is preferable, for example, to periodically check whether or not the base plate 61 is not excessively charged.

Here, it is conceivable that, for example, a worker opens a panel (not illustrated in the drawings) and enters the processing unit 16, and measures a charge amount of the base plate 61 by hand. However, an error involved in manual measurement is large. Further, by opening the panel, there is also a risk that foreign substance may enter the processing unit 16. Further, depending on a size of the processing unit 16, manual measurement itself may be difficult in some cases. On the other hand, it is also conceivable to provide a surface electrometer in the processing unit 16, but it is not preferable due to problems such as chemical resistance.

Figure 13:
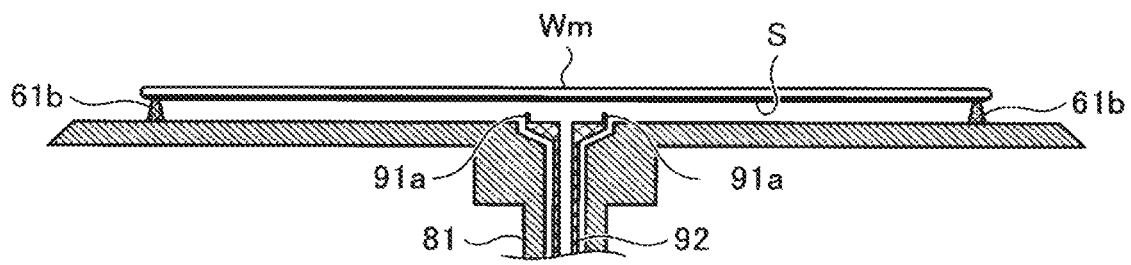
FIG. 13 is a diagram for describing content of a charge amount estimation process.
Figure 14:
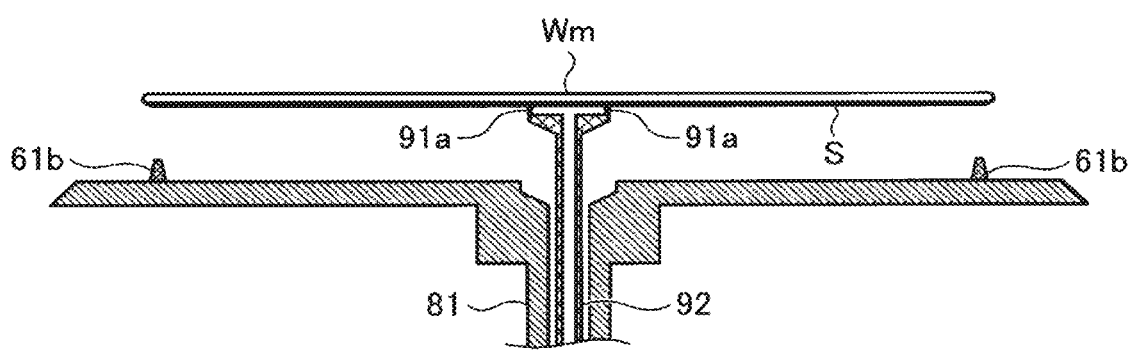
FIG. 14 is a diagram for describing the content of the charge amount estimation process.
Figure 15:
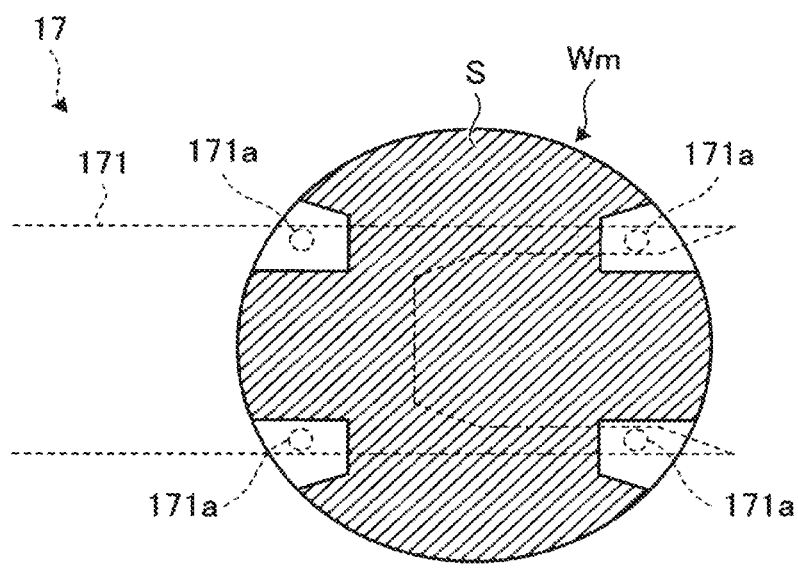
FIG. 15 illustrates a structure of a measurement substrate.
Figure 16:
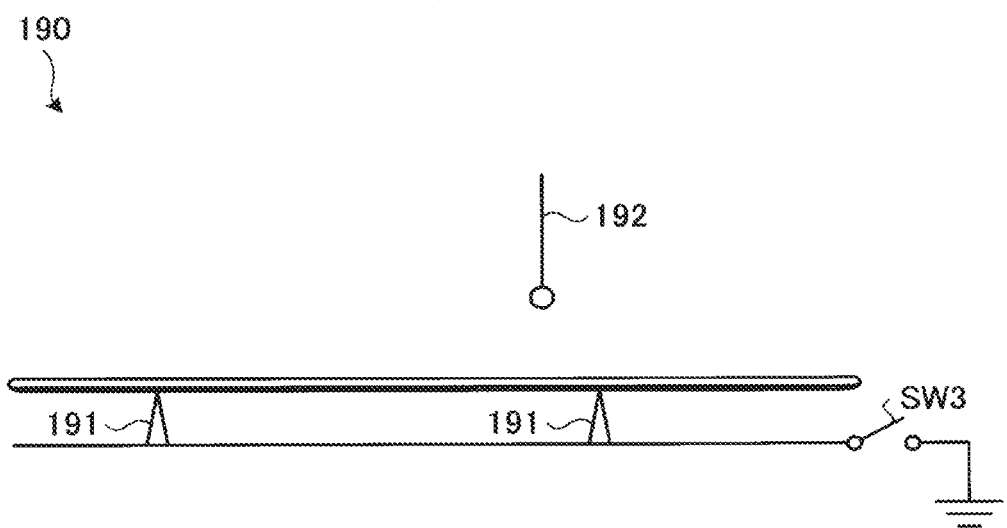
FIG. 16 illustrates a structure of a surface potential measurement part.

Therefore, in a fourth modified embodiment, a method that allows the charge amount of the base plate 61 to be easily measured is described with reference to FIGS. 13-16. FIGS. 13 and 14 are diagrams for describing content of a charge amount estimation process. Further, FIG. 15 illustrates a structure of a measurement substrate; and FIG. 16 illustrates a structure of a measurement part.

As illustrated in FIG. 13, in the charge amount estimation process according to the fourth modified embodiment, a measurement substrate (Wm) is used. The measurement substrate (Wm) is an insulating substrate. A conductive sheet (S) is affixed to a bottom surface of the measurement substrate (Wm).

Here, when the base plate 61 is charged, a positive charge is generated in the measurement substrate (Wm). In this state, as illustrated in FIG. 14, when the lift pins (91a) are raised and the measurement substrate (Wm) is separated from the support pins (61b), the measurement substrate (Wm) is positively charged. This charge amount, in principle, has the same value as an electrostatic induction potential received from the base plate 61 when the measurement substrate (Wm) is supported by the support pins (61b), and has an opposite polarity.

In a charge amount measurement process according to the fourth modified embodiment, after the lift pins (91a) are raised and the measurement substrate (Wm) is separated from the support pins (61b), the measurement substrate (Wm) is carried to a measurement part (to be described later) using the substrate transport device 17 (see FIG. 1). The lift pins (91a) are insulating, and an end effector 171 and support parts (171a) are conductive.

As illustrated in FIG. 15, the substrate transport device 17 has, for example, the bifurcated end effector 171. Multiple, for example, four support parts (171a) are provided on an upper surface of the end effector 171, and the measurement substrate (Wm) is placed on the support parts (171a).

The conductive sheet (S) affixed to the lower surface of the measurement substrate (Wm) is affixed to a place other than places corresponding to the support parts (171a) of the end effector 171. That is, the places that the support parts (171a) of the end effector 171 are in contact with are insulating. Therefore, a change in the charge amount of the measurement substrate (Wm) during carrying of the measurement substrate (Wm) can be suppressed.

Here, the charge amount estimation process is performed using the measurement substrate (Wm) that is obtained by affixing the conductive sheet (S) to the insulating substrate. However, in a case where a substrate itself is conductive, it is not necessary to use such a measurement substrate (Wm), and a charge amount measurement process may be performed, for example, using a product substrate. In this case, it is preferable that the support parts (171a) of the end effector 171 be insulating.

As illustrated in FIG. 16, the substrate processing system 1 has a measurement part 190 that measures the charge amount of the measurement substrate (Wm). The measurement part 190 is positioned, for example, in the delivery part 14 (see FIG. 1). However, the positioning place of the measurement part 190 is not limited to the delivery part 14. For example, it is also possible that a dedicated positioning place is provided in the processing station 3, and the measurement part 190 is positioned in such a place.

The measurement part 190 includes, for example, support members 191 that support the measurement substrate (Wm) from below, a surface electrometer 192 that measures a surface potential of the measurement substrate (Wm) supported by the support members 191, and a switch (SW3) for discharging. The switch (SW3) is in a closed state during measurement/ When the measurement is completed, the switch (SW3) is in an open state according to a control signal from the control unit 18. When the switch (SW3) is in the open state, the measurement substrate (Wm) is neutralized.

When a measurement result is acquired from the measurement part 190, the control unit 18 (see FIG. 1) estimates the charge amount of the base plate 61 based on the acquired measurement result.

Specifically, as described above, in principle, the charge amount of the measurement substrate (Wm) measured by the measurement part 190 has the same value as and opposite polarity to the charge amount of the base plate 61. Therefore, the control unit 18 estimates a charge amount having an opposite polarity to the acquired measurement result as the charge amount of the base plate 61.

In this way, by estimating the charge amount of the base plate 61 based on the measurement result of the measurement part 190, the charge amount of the base plate 61 can be measured using a simple method without depending on a manual operation of a worker and without having problems such as chemical resistance.

The charge amount of the measurement substrate (Wm) is actually smaller than the charge amount of the base plate 61 by an amount corresponding to a distance away from the support pins (61b). Therefore, the control unit 18 may estimate the charge amount of the base plate 61 by taking into account the decrease in the charge amount due to that the measurement substrate (Wm) is separated away from the support pins (61b). As a result, estimation accuracy of the charge amount of the base plate 61 can be improved.

For example, when the base plate 61 is charged to −6 kV, in principle, the measurement substrate (Wm) is charged to +6 kV. However, the charge amount of the measurement substrate (Wm) decreases by an amount corresponding to a rising distance of the measurement substrate (Wm) from the support pins (61b). In a case that the measurement substrate (Wm) is charged to +5 kV, the control unit 18 adds +1 kV, which is a correction amount corresponding to the rising distance of the measurement substrate (Wm) from the support pins (61b), to +5 kV, which is the measurement result of the measurement part 190, to obtain a total of +6 kV, and thereby, the control unit 18 can estimate the charge amount of the base plate 61 to be −6 kV.

The correction amount, for example, can be stored in the memory 19 in association with the rising distance of the measurement substrate (Wm) from the support pins (61b). The control unit 18 can acquire from the memory 19 the correction amount corresponding to the rising distance of the measurement substrate (Wm) from the support pins (61b) in the charge amount estimation process, and can correct the measurement result using the acquired correction amount. It is also possible that the control unit 18 obtains the correction amount corresponding to the rising distance of the measurement substrate (Wm) from the support pins (61b) by calculation.

When the estimated charge amount of the base plate 61 exceeds a predetermined threshold, the control unit 18 may perform a predetermined abnormality handling process. For example, as an abnormal handling process, the control unit 18 can notify that the charge amount of the base plate 61 exceeds the threshold by using a lamp or a speaker (not illustrated in the drawings) or can stop the substrate processing.

Here, an example of a case is described where, after the measurement substrate (Wm) held by the holding part 60 is raised by the lift pins (91*a*), the substrate transport device 17 receives the measurement substrate (Wm) from the lift pins (91*a*) and carries the measurement substrate (Wm) to the measurement part 190. However, without being limited to this, it is also possible that the substrate transport device 17 directly receives the measurement substrate (Wm) from the holding part 60 and carries the measurement substrate (Wm) to the measurement part 190. Also in this case, the charge amount of the base plate 61 can be estimated in the same way as described above.

Fifth Modified Embodiment

As illustrated in FIG. 2, the peripheral edge portion of the top plate 110 facing the peripheral edge portion of the wafer (W) supported by the support pins (61*b*) is provided projecting downward toward the wafer (W), and the gap (D1) is formed between the peripheral edge portion of the top plate 110 and the peripheral edge portion of the wafer (W).

The gap (D1) is smaller than the distance between the center portion of the wafer (W) supported by the support pins (61*b*) and the top plate 110. Therefore, a flow velocity of an airflow flowing from the center portion of the wafer (W) to the peripheral edge portion may decrease in the gap (D1). Further, frictional resistance due to viscosity of the airflow is also likely to occur.

Figure 17:
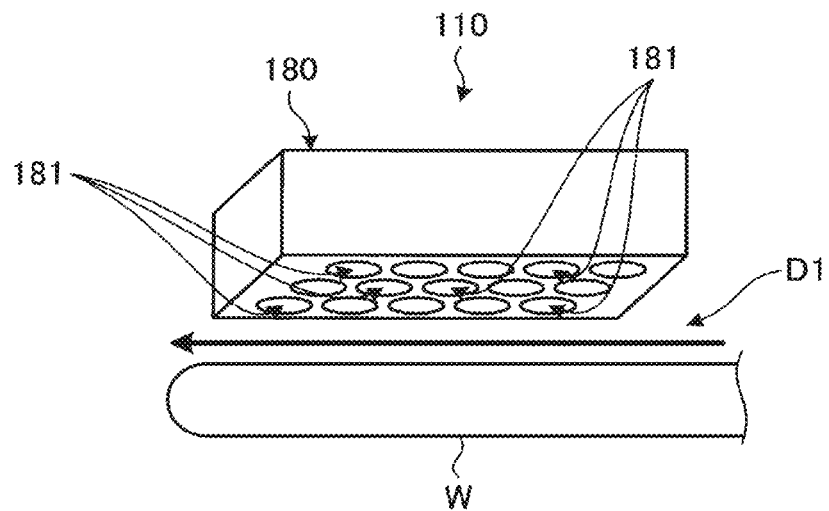
FIG. 17 is an enlarged schematic view of a rectifier.
Figure 18:
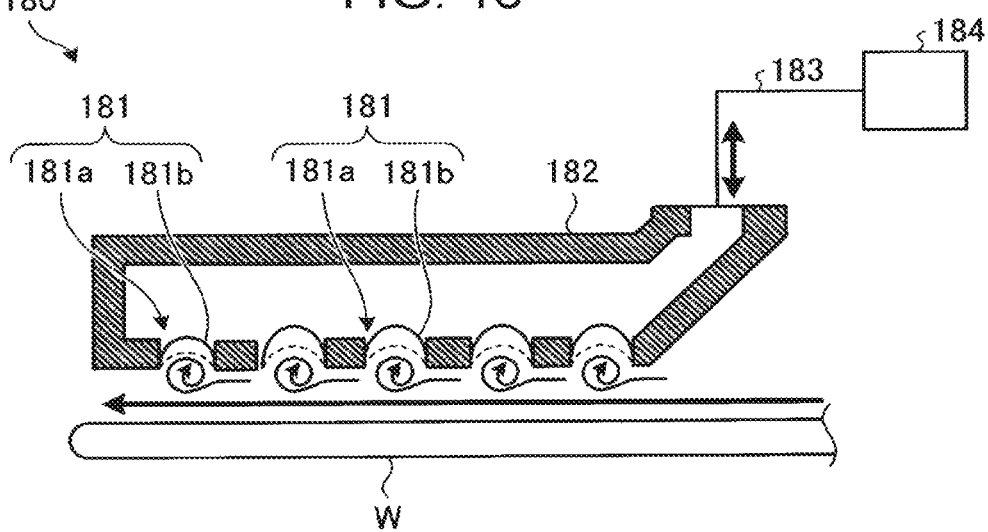
FIG. 18 is a schematic cross-sectional view of the rectifier.

Therefore, in a fifth modified embodiment, a structure for suppressing turbulence of the airflow in the gap (D1) is described with reference to FIGS. 17 and 18. FIG. 17 is an enlarged schematic view of a rectifier. FIG. 18 is a schematic cross-sectional view of the rectifier. FIG. 17 is an enlarged schematic view of a portion corresponding to an H portion in FIG. 2.

As illustrated in FIG. 17, the top plate 110 has a rectifier 180 in a portion corresponding to the gap (D1).

The rectifier 180 has multiple recesses 181 on a lower surface, that is, a surface facing the peripheral edge portion of the wafer (W). In this way, since the lower surface of the rectifier 180 has a so-called dimple shape, the frictional resistance in the gap (D1) can be reduced.

Here, the airflow from the central portion of the wafer (W) to the peripheral edge portion varies, for example, depending on a displacement of processing unit 16 or the rotation speed of the wafer (W). Therefore, the rectifier 180 is structured to be able to adjust strength of a rectification effect according to variation of the airflow.

Specifically, as illustrated in FIG. 18, the rectifier 180 has a hollow main body 182. A fluid supply part 184 is connected to the main body 182 via a supply pipe 183. The fluid supply part 184 supplies a fluid to an inner space of the main body 182. Further, the fluid supply part 184 can also suck the fluid supplied to the inner space of the main body 182. The fluid supplied from the fluid supply part 184 is, for example, an inert gas such as a nitrogen gas or an argon gas. However, it is also possible that the fluid is a liquid such as pure water.

The above-described recesses 181 each include an opening (181*a*) formed on a lower surface of the main body 182 and a stretchable film (181*b*) affixed to the opening (181*a*).

The rectifier 180 is structured as described above, and can adjust concavity or convexity of the films (181*b*) of the recesses 181 by varying a pressure in the inner space of the main body 182 by supplying a fluid from the fluid supply part 184 to the inner space of the main body 182 or sucking the fluid from the inner space of the main body 192 according to the control unit 18.

As a result, by adjusting depths of the recesses 181 according to situations where the airflow changes such as the displacement and the rotation speed, the airflow flowing through the gap (D1) can be appropriately rectified.

In the processing unit 16, when the processing liquid supply process is completed and the processing proceeds to the drying treatment, the rotation speed of the wafer (W) is increased (see FIG. 7). Therefore, when the processing proceeds to the drying treatment, the control unit 18 controls the fluid supply part 184 to suck the fluid from the inner space of the main body 182 to deepen the recesses 181. As a result, the airflow flowing through the gap (D1) during the drying treatment can be appropriately rectified.

When multiple processing liquids are used, there are cases where the displacement is switched for each processing liquid. Therefore, the control unit 18 may control the fluid supply part 184 to adjust the depths of the recesses 181 when switching of processing liquids. For example, in a case where a rinse treatment using pure water is performed after a processing liquid is supplied and thereafter a replacement process using IPA (isopropyl alcohol) is performed, when the processing proceeds from the rinse treatment to the replacement process, the displacement may be reduced. In this case, when the processing proceeds from the rinse process to the replacement process, the control unit 18 controls the fluid supply part 184 to supply a fluid to the inner space of the main body 182 to shallow the recesses 181. As a result, the airflow flowing through the gap (D1) during the replacement process can be appropriately rectified.

The processing unit 16 (an example of a substrate processing apparatus) according to the present embodiment includes the conductive holding part 60, the conductive rotation mechanism 80 (an example of a conduction path part), the processing liquid supply part 100 (an example of a supply part), the grounding part 150, and the variable resistance part 160. The holding part 60 holds the wafer (W) (an example of a substrate). The rotation mechanism 80 is in contact with the holding part 60, and is formed of a conductive material. The processing liquid supply part 100 supplies a processing liquid to the wafer (W) held by the holding part 60. One end part of the grounding part 150 is connected to the rotation mechanism 80, and the other end part of the grounding part 150 is connected to a ground potential. The variable resistance part 160 is provided in the grounding part 150, and has a variable resistance.

Therefore, according to the processing unit 16 of the present embodiment, the resistance of the conduction path for the electricity generated in the wafer (W) can be varied according to a substrate processing situation. Therefore, in a series of substrate processing processes, the wafer (W) can be properly protected from an electrical damage.

The processing unit 16 has the control unit 18 that controls the variable resistance part 160. The control unit 18 controls the variable resistance part 160 such that, during the processing liquid supply period (T), which is a period from when the supply of the processing liquid to the wafer (W) is started to when the supply of the processing liquid to the wafer (W) is finished, the resistance of the variable resistance part 160 immediately after the start of this period is higher than the resistance of the variable resistance part 160 thereafter.

As a result, it is possible to suppress occurrence of the electric discharge phenomenon caused by that a charged processing liquid arrives at the wafer (W) when the resistance of the conduction path is low. Therefore, in a series of substrate processing processes, the wafer (W) can be properly protected from an electrical damage.

The variable resistance part 160 includes the first resistor 161, the second resistor 162, the first switch (SW1), and the second switch (SW2) (an example of a switching part). The first resistor 161 has the first resistance. The second resistor 162 has the second resistance that is higher than the first resistance. The first switch (SW1) and the second switch (SW2) switch the resistor connected to the grounding part 150 between the first resistor 161 and the second resistor 162. Further, the control unit 18 controls the first switch (SW1) and the second switch (SW2) to connect the second resistor 162 to the grounding part 150 immediately after the start of the processing liquid supply period (T), and thereafter, connect the first resistor 161 to the grounding part 150.

As a result, the resistance of the conduction path in the period immediately after the supply of the processing liquid to the wafer (W) is started can be increased to be higher than that in the subsequent period. Therefore, even when a charged processing liquid arrives at the wafer (W), an electric current hardly flows in the wafer (W) and the electric discharge phenomenon is unlikely to occur. Therefore, damage to a pattern due to the electric discharge can be prevented. Therefore, in a series of substrate processing processes, the wafer (W) can be properly protected from an electrical damage.

The variable resistance part 160 may be a variable resistor that changes a resistance according to a signal input from the control unit 18. Even in such a case, in a series of substrate processing processes, the wafer (W) can be properly protected from an electrical damage.

The rotation mechanism 80 includes the conductive rotation shaft (81, 81A), the electric motor 82, the conductive container 84, and the conductive connection member (85, 85A). The rotation shaft (81, 81A) is in electrical contact with the holding part 60 and rotatably supports the holding part 60. The electric motor 82 rotates the rotation shaft (81, 81A). The conductive liquid (L) is stored in the container 84. One end part of the connection member (85, 85A) is in electrical contact with the rotation shaft (81, 81A), and the other end part of the connection member (85, 85A) is immersed in the liquid (L). Further, one end part of the grounding part 150 is connected to the container 84 in the rotation mechanism 80.

The connection member (85A) has a rod shape extending in the longitudinal direction, and is connected coaxially with the rotation shaft to an end on an opposite side of a load side of the rotation shaft (81A).

In this way, by structuring a path that does not include the bearing as the conduction path for the electricity generated in the wafer (W), the resistance of the conduction path can be stabilized.

The rotation mechanism 80 includes the insulating bearing (83A) that is provided between the electric motor 82 and the rotation shaft (81, 81A) and rotatably supports the rotation shaft (81, 81A). In this way, by using the insulating bearing (83A), conduction via an unintended path can be prevented.

The processing unit 16 includes the measurement part 190, the substrate transport device 17 (an example of a substrate transport part, and the control unit 18 (an example of an estimation part). The measurement part 190 measures a charge amount of the wafer (W). The substrate transport device 17 passes the wafer (W) held by the holding part 60 to the measurement part 190. The control unit 18 estimates a charge amount of the holding part 60 based on a measurement result of the measurement part 190.

In this way, by estimating the charge amount of the holding part 60 based on the measurement result of the measurement part 190, the charge amount of the holding part 60 can be measured using a simple method without depending on a manual operation of a worker and without having problems such as chemical resistance.

The control unit 18 estimates the charge amount of the holding part 60 using the measurement result of the measurement part 190 and a correction amount that corresponds to an amount of displacement of the measurement substrate (Wm) from the holding part 60 due to the cylinder mechanism (92a) when the measurement substrate (Wm) is passed to the substrate transport device 17. As a result, estimation accuracy of the charge amount of the holding part 60 can be improved.

A substrate processing apparatus processes a substrate such as a semiconductor wafer or a glass substrate by supplying a processing liquid to the substrate.

In a substrate processing apparatus of this kind, for example, when a processing liquid flows on a surface of a substrate, static electricity may be generated due to frictional charging or the like. Therefore, in the substrate processing apparatus described in Japanese Patent Laid-Open Publication No. 2003-092343, by structuring at least a portion of a holding part using a conductive material, static electricity is prevented from staying in the holding part, and a substrate held by the holding part is prevented from being affected by the static electricity.

Basically, it is preferable that a conduction path for neutralizing a substrate have low a resistance. However, depending on a situation of a series of substrate processing processes, in some cases it is not preferable for the conduction path to have a low resistance. For example, when the resistance of the conduction path is too low, electric current flows to the substrate at once, and a pattern on the substrate may be damaged.

A substrate processing apparatus and a substrate processing method according to embodiments of the present invention can properly protect a substrate from an electrical damage.

A substrate processing apparatus according to an embodiment of the present invention includes a conductive holding part, a conduction path part, a supply part, a grounding part, and a variable resistance part. The holding part holds a substrate. The conduction path part is in contact with the holding part and is formed of a conductive material. The supply part supplies a processing liquid to the substrate held by the holding part. One end part of the grounding part is connected to the conduction path part, and the other end part of the grounding part is connected to a ground potential. The variable resistance part is provided in the grounding part, and has a variable resistance.

According to an embodiment of the present invention, the substrate can be properly protected from an electrical damage.

Obviously, numerous modifications and variations of the present invention are possible in light of the above teachings. It is therefore to be understood that within the scope of the appended claims, the invention may be practiced otherwise than as specifically described herein.

The invention claimed is:
1. A substrate processing apparatus, comprising:
a holding device comprising a conductive member and configured to hold a substrate;

a supply device configured to supply a processing liquid to the substrate held by the holding device;

a conduction path structure comprising a conductive material and formed such that the conduction path structure is in contact with the conductive member of the holding device;

a grounding structure connected to the conduction path structure at a first end portion of the grounding structure and to a ground potential at a second end portion of the grounding structure and comprising a variable resistance device configured to change a resistance of the grounding structure; and a control device comprising circuitry configured to control the variable resistance device such that during a supply period from a time when the supply of the processing liquid to the substrate is started to a time when the supply of the processing liquid to the substrate is finished, the resistance of the variable resistance device immediately after the start of the supply period is higher than the resistance of the variable resistance device thereafter, wherein the conductive member of the holding device and the conduction path structure are configured to conduct static electricity generated in the substrate held by the holding device from the conductive member of the holding device to the ground potential and neutralize the substrate held by the holding device during a liquid substrate processing by the supply device, the variable resistance device comprises a first resistor having a first resistance, a second resistor having a second resistance that is higher than the first resistance, and a switch that switches between the first resistor and the second resistor such that one of the first resistor and the second resistor is connected to the grounding structure, and the circuitry of the control device is configured to control the switch such that the switch connects the second resistor to the grounding structure immediately after the start of the supply period and thereafter connects the first resistor to the grounding structure.

2. The substrate processing apparatus of claim 1, wherein the variable resistance device is a variable resistor that changes a resistance according to a signal input from the circuitry of the control device.

3. The substrate processing apparatus of claim 1, wherein the conduction path structure is a rotation mechanism configured to rotate the holding device.

4. The substrate processing apparatus of claim 3, wherein the rotation mechanism comprises a conductive rotation shaft in electrical contact with the holding device and rotatably supporting the holding device, an electric motor configured to rotate the rotation shaft, a conductive container configured to store a conductive liquid, and a conductive connection member having a first end portion in electrical contact with the rotation shaft and a second end portion positioned to be immersed in the liquid, and the grounding structure has the first end portion connected to the conductive container of the rotation mechanism.

5. The substrate processing apparatus of claim 4, wherein the conductive connection member has a rod shape extending in a longitudinal direction and is connected coaxially with the rotation shaft such that the conductive connection member is connected to an end of the rotation shaft on an opposite side with respect to a load end of the rotation shaft.

6. The substrate processing apparatus of claim 4, wherein the rotation mechanism comprises an insulating bearing positioned between the electric motor and the rotation shaft such that the insulating bearing is rotatably supporting the rotation shaft.

7. The substrate processing apparatus of claim 1, further comprising:

a measurement device configured to measure a charge amount of the substrate;

a substrate transport device configured to carry the substrate held by the holding device to the measurement device; and an estimation device configured to estimate a charge amount of the holding device based on a measurement result of the measurement device.

8. The substrate processing apparatus of claim 7, wherein the estimation device is configured to estimate the charge amount of the holding device based on the measurement result and a correction amount corresponding to a rising amount of the substrate from the holding device when the substrate is received from the holding device.

9. The substrate processing apparatus of claim 5, wherein the rotation mechanism comprises an insulating bearing positioned between the electric motor and the rotation shaft such that the insulating bearing is rotatably supporting the rotation shaft.

10. The substrate processing apparatus of claim 2, wherein the conduction path structure is a rotation mechanism configured to rotate the holding device.

11. The substrate processing apparatus of claim 10, wherein the rotation mechanism comprises a conductive rotation shaft in electrical contact with the holding device and rotatably supporting the holding device, an electric motor configured to rotate the rotation shaft, a conductive container configured to store a conductive liquid, and a conductive connection member having a first end portion in electrical contact with the rotation shaft and a second end portion positioned to be immersed in the liquid, and the grounding structure has the first end portion connected to the conductive container of the rotation mechanism.

12. A substrate processing method, comprising:

holding a substrate by a holding device comprising a conductive member and configured to hold the substrate in a substrate processing apparatus; and supplying a processing liquid to the substrate by a supply device configured to supply the processing liquid to the substrate held by the holding device, wherein the supplying of the processing liquid includes changing a resistance between the substrate and the ground potential by a variable resistance device configured to change the resistance, the substrate processing apparatus comprises the holding device, the supply device, a conduction path structure comprising a conductive material and formed such that the conduction path structure is in contact with the conductive member of the holding device, a grounding structure connected to the conduction path structure at a first end portion of the grounding structure and to a ground potential at a second end portion of the grounding structure and comprising the variable resistance device configured to change the resistance of the grounding structure, and a control device comprising circuitry configured to control the variable resistance device such that during a supply period from a time when the supply of the processing liquid to the substrate is started to a time when the supply of the processing liquid to the substrate is finished, the resistance of the variable resistance device immediately after the start of the supply period is higher than the resistance of the variable resistance device thereafter, the conductive member of the holding device and the conduction path structure are configured to conduct static electricity generated in the substrate held by the holding device from the conductive member of the holding device to the ground potential and neutralize the substrate held by the holding device during a liquid substrate processing by the supply device, the variable resistance device comprises a first resistor having a first resistance, a second resistor having a second resistance that is higher than the first resistance, and a switch that switches between the first resistor and the second resistor such that one of the first resistor and the second resistor is connected to the grounding structure, and the circuitry of the control device is configured to control the switch such that the switch connects the second resistor to the grounding structure immediately after the start of the supply period and thereafter connects the first resistor to the grounding structure.

13. A substrate processing apparatus, comprising:
a holding device comprising a conductive member and configured to hold a substrate;
a supply device configured to supply a processing liquid to the substrate held by the holding device;
a conduction path structure comprising a conductive material and formed such that the conduction path structure is in contact with the conductive member of the holding device; and
a grounding structure connected to the conduction path structure at a first end portion of the grounding structure and to a ground potential at a second end portion of the grounding structure and comprising a variable resistance device configured to change a resistance of the grounding structure,
wherein the conductive member of the holding device and the conduction path structure are configured to conduct static electricity generated in the substrate held by the holding device from the conductive member of the holding device to the ground potential and neutralize the substrate held by the holding device during a liquid substrate processing by the supply device, the conduction path structure is a rotation mechanism configured to rotate the holding device and comprising a conductive rotation shaft in electrical contact with the holding device and rotatably supporting the holding device, an electric motor configured to rotate the rotation shaft, a conductive container configured to store a conductive liquid, and a conductive connection member having a first end portion in electrical contact with the rotation shaft and a second end portion positioned to be immersed in the liquid, and the grounding structure has the first end portion connected to the conductive container of the rotation mechanism.

14. The substrate processing apparatus of claim 13, wherein the conductive connection member has a rod shape extending in a longitudinal direction and is connected coaxially with the rotation shaft such that the conductive connection member is connected to an end of the rotation shaft on an opposite side with respect to a load end of the rotation shaft.

15. The substrate processing apparatus of claim 13, wherein the rotation mechanism comprises an insulating bearing positioned between the electric motor and the rotation shaft such that the insulating bearing is rotatably supporting the rotation shaft.

16. The substrate processing apparatus of claim 13, further comprising:
a measurement device configured to measure a charge amount of the substrate;
a substrate transport device configured to carry the substrate held by the holding device to the measurement device; and
an estimation device configured to estimate a charge amount of the holding device based on a measurement result of the measurement device.

17. The substrate processing apparatus of claim 16, wherein the estimation device is configured to estimate the charge amount of the holding device based on the measurement result and a correction amount corresponding to a rising amount of the substrate from the holding device when the substrate is received from the holding device.

18. The substrate processing apparatus of claim 14, wherein the rotation mechanism comprises an insulating bearing positioned between the electric motor and the rotation shaft such that the insulating bearing is rotatably supporting the rotation shaft.

19. The substrate processing apparatus of claim 13, further comprising:
a control device comprising circuitry configured to control the variable resistance device,
wherein the circuitry of the control device is configured to control the variable resistance device such that during a supply period from a time when the supply of the processing liquid to the substrate is started to a time when the supply of the processing liquid to the substrate is finished, the resistance of the variable resistance device immediately after the start of the supply period is higher than the resistance of the variable resistance device thereafter.

20. The substrate processing apparatus of claim 19, wherein the variable resistance device is a variable resistor that changes a resistance according to a signal input from the circuitry of the control device.

* * * * *